(12) United States Patent
Willey et al.

(10) Patent No.: US 8,788,223 B2
(45) Date of Patent: Jul. 22, 2014

(54) COMPREHENSIVE METHOD OF ELECTRICAL FLUID HEATING SYSTEM FAULT DETECTION AND HANDLING

(75) Inventors: Mark R. Willey, Grand Blanc, MI (US); Charles J. Bongiorno, Sterling Heights, MI (US); David A. Bodenmiller, Dearborn, MI (US); Craig Atiyeh, Grand Blanc, MI (US); Aaron C. Osmun, Clarkston, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 397 days.

(21) Appl. No.: 13/247,175

(22) Filed: Sep. 28, 2011

(65) Prior Publication Data

US 2012/0109547 A1 May 3, 2012

Related U.S. Application Data

(60) Provisional application No. 61/408,446, filed on Oct. 29, 2010.

(51) Int. Cl.
| | |
|---|---|
| G01R 31/00 | (2006.01) |
| G06F 19/00 | (2011.01) |
| H02H 1/00 | (2006.01) |
| G01R 31/02 | (2006.01) |
| G01R 31/34 | (2006.01) |
| G01R 31/12 | (2006.01) |
| G01R 31/08 | (2006.01) |
| B60H 1/22 | (2006.01) |

(52) U.S. Cl.
CPC ........... *H02H 1/0015* (2013.01); *G01R 31/025* (2013.01); *G01R 31/343* (2013.01); *G01R 31/1272* (2013.01); *G01R 31/088* (2013.01); *B60H 2001/2231* (2013.01)
USPC ........... 702/58; 237/12.3 C; 239/128; 361/25; 701/29.2

(58) Field of Classification Search
CPC . F02D 41/062; F02D 41/222; F02D 41/1494; F02P 19/027; G05B 19/0423; G01K 7/22; G01R 31/00; G06F 19/00; H05B 19/0423; H05B 1/0236; H05B 41/36; H05B 41/2882; B60H 1/00; B60R 16/02
USPC ......................................................... 702/58
See application file for complete search history.

(56) References Cited

U.S. PATENT DOCUMENTS

| | | | | |
|---|---|---|---|---|
| 5,229,579 | A | * | 7/1993 | Ingraham et al. ............. 219/202 |
| 5,331,258 | A | * | 7/1994 | Lankin et al. ................. 318/139 |
| 5,354,965 | A | * | 10/1994 | Lee ................ 219/202 |
| 5,555,725 | A | * | 9/1996 | Shimasaki et al. ............. 60/277 |
| 5,878,950 | A | * | 3/1999 | Faccone et al. .......... 237/12.3 C |
| 6,082,625 | A | * | 7/2000 | Faccone et al. .......... 237/12.3 C |
| 6,669,109 | B2 | * | 12/2003 | Ivanov et al. .............. 239/284.1 |
| 7,459,805 | B2 | * | 12/2008 | Kowari et al. ................. 307/130 |
| 8,483,905 | B2 | * | 7/2013 | Toda et al. ................... 701/34.4 |

(Continued)

*Primary Examiner* — Carol S Tsai
(74) *Attorney, Agent, or Firm* — Cantor Colburn LLP (57) ABSTRACT

A method and system are provided to eliminate the risk of over temperature concerns associated with electrical heating devices, which if undetected may result in an electrical over temperature condition. The electrical heating system may be applied to the detection and control structure of other automotive electrical loads where thermal concerns may exist. The electrical heating system combines several layers of fault detection strategies, to form a unique comprehensive approach to prevent and detect potential electrical fault conditions, which if undetected and/or controlled may result in an electrical over temperature condition.

20 Claims, 5 Drawing Sheets

(56) References Cited

U.S. PATENT DOCUMENTS

| | | | |
|---|---|---|---|
| 2007/0194721 A1* | 8/2007 | Vorperian et al. | 315/247 |
| 2007/0195562 A1* | 8/2007 | Sato | 363/21.12 |
| 2010/0018962 A1* | 1/2010 | Kabasin et al. | 219/482 |
| 2010/0256866 A1* | 10/2010 | Toda et al. | 701/34 |

* cited by examiner

Microprocessor Operations Table 300

| | Operation | FET 7 | FET 8 | Analog Input 9 | OP Amp 6 and/or software logic |
|---|---|---|---|---|---|
| 305 | Normal | ON | OFF | Logic power voltage | |
| 310 | Fault | On | OFF | Ground (0 volts) (or different voltage than logic power voltage) | |
| 315 | Normal | OFF | OFF | ½ Logic power voltage | |
| 320 | Fault | OFF | OFF | Not ½ Logic power voltage | |
| 325 | Normal | OFF | ON | Ground | |
| 330 | Fault | OFF | ON | Not Ground | |
| 335 | Normal | ON | ON | | Current in =Current out |
| 340 | Fault | ON | ON | | Current in ≠ Current out |
| 345 | Fault | ON | ON | | Current in greater than threshold |

FIG. 4

Microprocessor Operations Table

400

| Operation | 1st Thermistor (lower part) | 2nd Thermistor (upper part) | Determination |
|---|---|---|---|
| Normal | Same temp | Same temp | Fine |
| Normal | Higher Temp | Lower Temp | Difference in temps not greater than temp difference threshold |
| Fault | Higher Temp | Lower Temp | Difference in temp greater than temp difference threshold |
| Fault | Too high temp | Normal temp | Temp greater than over temperature threshold |
| Fault | Normal temp | Too high temp | Temp greater than over temperature threshold |

405
410
415
420
425

FIG. 5

COMPREHENSIVE METHOD OF ELECTRICAL FLUID HEATING SYSTEM FAULT DETECTION AND HANDLING

CROSS-REFERENCES TO RELATED APPLICATIONS

This patent application claims priority to U.S. Provisional Patent Application Ser. No. 61/408,446 filed Oct. 29, 2010 which is hereby incorporated herein by reference in its entirety.

FIELD OF THE INVENTION

Exemplary embodiments relate to electrical heating systems, and more particularly to, fault detection and handling in heating systems.

BACKGROUND

Heating systems are used in vehicles to provide comfort to the driver and passengers, as well as for functional aspects of the vehicle. Although heating systems normally work as designed, heating systems may have a risk of operating in an out of specification state in vehicles for various reasons.

SUMMARY OF EMBODIMENTS

According to an exemplary embodiment, a heating system for a vehicle and a method for the heating system are provided. A heating control module includes a microprocessor configured for heating fault detection and heating fault handling, a first field effect transistor (FET) operatively connected to the microprocessor, and a second field effect transistor (FET) operatively connected to the microprocessor. A heating module includes a heating element, a first thermistor operatively connected to the microprocessor, and a second thermistor operatively connected to the microprocessor. The microprocessor is configured to determine a fault condition when a temperature difference between a first temperature of the first thermistor and a second temperature of the second thermistor exceeds a temperature difference threshold, and determine the fault condition when at least one of the first temperature of the first thermistor and/or the second temperature of the second thermistor is less than a minimum temperature after the first FET is powered on and the second FET is powered on, and determine the fault condition when at least one of the first temperature of the first thermistor and/or the second temperature of the second thermistor is more than a maximum temperature after either the first FET is powered on and/or the second FET is powered on. The microprocessor is configured to determine the fault condition when the first FET is powered on and the second FET is powered off and when the microprocessor does not detect logic voltage at an analog input, and determine the fault condition when the first FET is powered off and the second FET is powered off and when the microprocessor does not detect half the logic voltage at the analog input.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

The following description is merely exemplary in nature and is not intended to limit the present disclosure, its application or uses. It should be understood that throughout the drawings, corresponding reference numerals indicate like or corresponding parts and features.

In accordance with an exemplary embodiment of the invention this disclosure provides a method and system to eliminate out of specification temperature operation associated with electrical heating devices. Exemplary embodiments describe an electrical heating system, but may be applied to the detection and control structure of other automotive electrical loads where thermal operations may exist.

In accordance with exemplary embodiments, the electrical heating system combines several layers of thermal detection strategies, to form a unique comprehensive approach to prevent and detect potential electrical thermal conditions, which if undetected and/or uncontrolled may result in an out of specification electrical condition.

Figure 1:
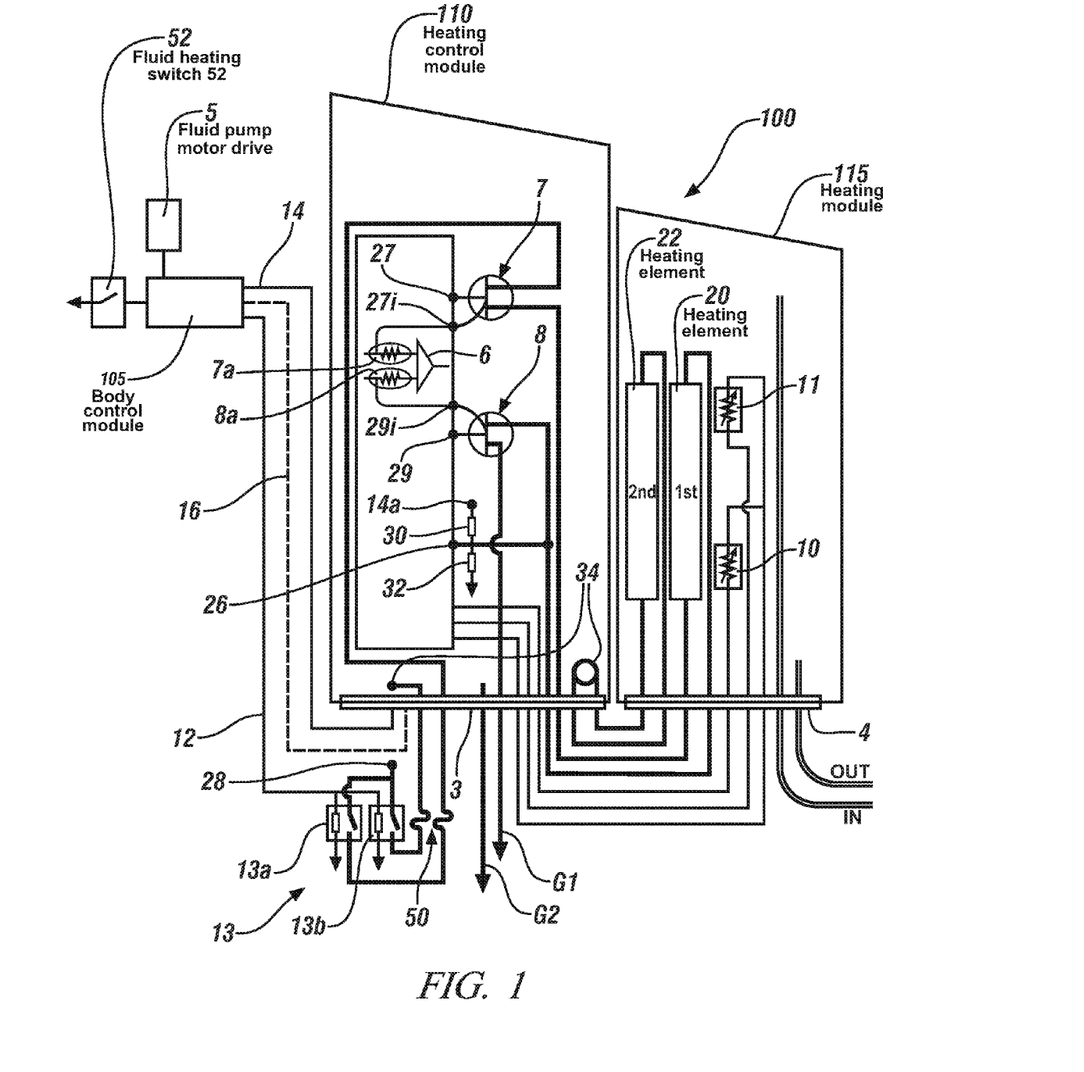
FIG. 1 illustrates a block diagram of an electrical heating system in accordance with exemplary embodiments.

Now turning to FIG. 1, FIG. 1 illustrates a block diagram of an electrical heating system 100 in accordance with exemplary embodiments. The electrical heating system 100 includes a body control module (BCM) 105, a heating control module 110, and a heating module 115. The heating system 100 may be operated in a vehicle. The BCM 105 includes a processor and software in memory for operating in accordance with exemplary embodiments.

The heating system 100 combines several layers of thermal detection strategies to form a comprehensive approach to safeguard against potential out of specification conditions. An out of specification condition results when the temperature of a device deviates from its temperature rating.

The BCM 105 switches high power to the heating control module 110 (only) when heating is required. Via cable 12, the BCM 105 controls two relays 13 (which may be individually referred to as a first relay 13a and second relay 13b) which are operatively connected to a high power battery supply (which is battery 28) and operatively connected to ground. Also, the two relays 13 are operatively connected to sealed connectors 3 located at the bottom of the housing for the heating control module 110. Based on close (and open) command(s) from the BCM 105, the two relays 13 close (and open) to provide voltage to the heating control module 110, which powers a first heating element 20 (i.e., heater) and second heating element 22 (i.e., heater) in the heating module 115.

The BCM 105 (only) provides very low logic power via cable 14 to the heating control module 110 when the activation of a heating feature may be required. Examples of heating features include heated seats, heated window washing fluid, engine coolant, heater fluid, etc. For the logic power that runs a microprocessor 24 (e.g., controller) of the heating control module 110, the BCM 105 provides, e.g., a maximum of 250 ma (milliamps) of current but the heating control module 110 should typically only be allowed a maximum current draw of 100 ma.

The BCM 105 will not provide power to the heating control module 110 when the vehicle is asleep (e.g., when the vehicle is not turned on), eliminating out of specification heating when the vehicle is unattended.

Note that cables 14 and 16 are shown as connected to sealed connector 3, and sealed connector 3 operatively connects by cables (not shown so as not to obscure the details of FIG. 1) to the microprocessor 24. The cable 16 may be a serial bus such as a local interconnect network (LIN) bus as understood by one skilled in the art, which shall also only provide current when heating is required. The cable 14 provides logic power to the microprocessor 24.

Figure 2:
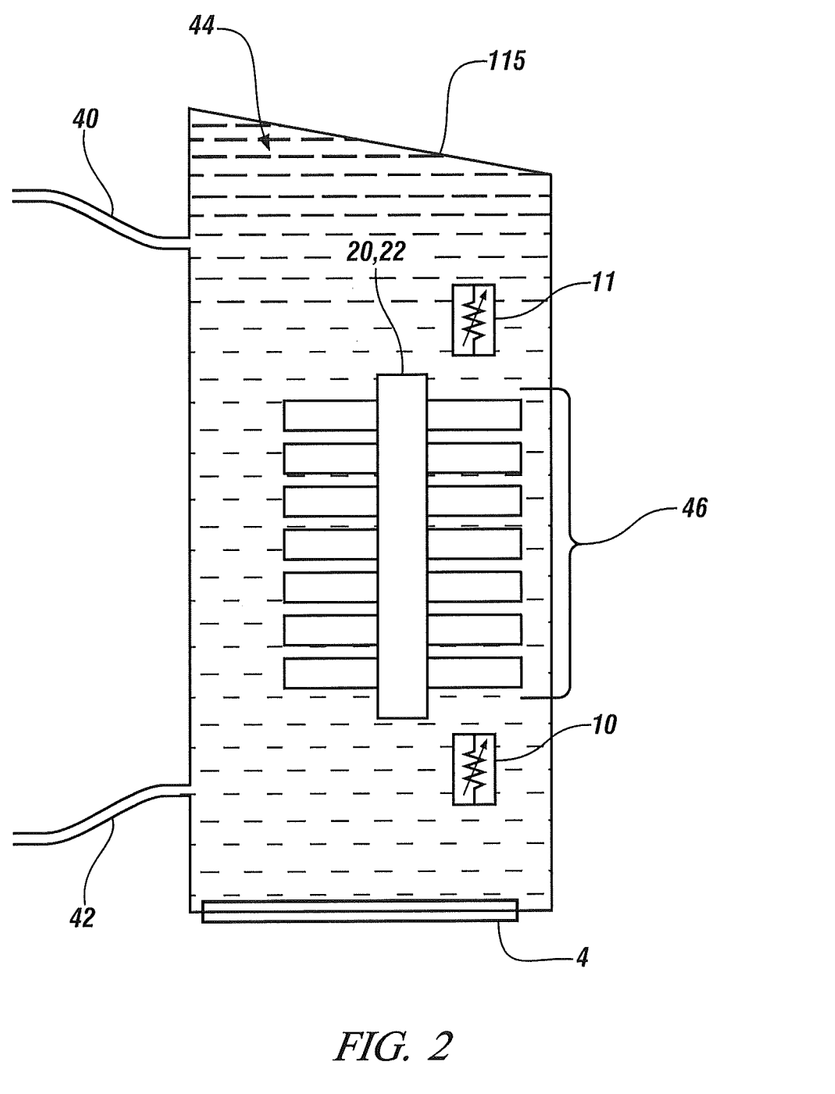
FIG. 2 illustrates an example implementation in accordance with exemplary embodiments.

The heating module 115 has a heating element design that evenly distributes fluid heating. The first heating element 20 and the second heating element 22 are designed to evenly distribute heating to fluids. In one example implementation, FIG. 2 illustrates the heating module 115 filled with fluid 44 that enters the module through input tube 40 and exits the module through output tube 42 (e.g., to a heated wash system). While only showing the first heating element 20 (which represents the configuration for the second heating element 22), the first heating element 20 includes heat conductor (e.g., metal or ceramic) fins 46 designed to evenly transfer heat to the fluid 44. In another embodiment, the fluid may be contained in a chamber where the chamber walls are the heating elements. The heat conductor fins 46 maximize the heat transfer surface area and act as a heat sink for delivery of heat to fluid 44 in the heating module 115. For conciseness, various elements shown in FIG. 1 are omitted in FIG. 2 so as not to obscure FIG. 2. It is appreciated that each element in FIG. 2 is operatively connected as shown in FIG. 1.

The heating module 115 may include temperature-sensing thermistors 10 and 11 in the heating chamber (which is the internal housing of the heating module 115) to detect when heating is not being evenly provided. The $1^{st}$ thermistor 10 may be located at the lower part of the heating chamber, and the $2^{nd}$ thermistor 11 may be located at the upper part of the heating chamber of the heating module 115. If fluid heating is occurring, the $1^{st}$ thermistor 10 and $2^{nd}$ thermistor 11 act as sensors that detect the temperatures at their respective locations. Based on a temperature differential between the $1^{st}$ thermistor 10 at the lower part of the heating chamber and the $2^{nd}$ thermistor at the upper part of the heating chamber, the microprocessor 24 in FIG. 1 can determine low and/or missing fluid 44 in the heating chamber of the heating module 115.

Further, when the microprocessor 24 detects multiple temperatures within the heating chamber (which is not necessarily required to be filled with fluid 44) and when there is a significant (e.g., predefined) temperature difference between thermistors 10 and 11, the microprocessor 24 assumes a heating element fault of heating elements 20, 22, assumes low fluid 44, and/or assumes a fluid boil out condition. In any case, the microprocessor 24 terminates heating by terminating all power to the heating module 115 via FETs 7 and 8, and the microprocessor 24 reports faults via serial data to the BCM 105, which will turn off all power to the heating elements 20 and 22 by opening relays 13.

The heating control module 110 includes a voltage divider resistor pair comprising resistors 30 and 32 connected in series. The resistor 30 is connected to and powered by the BCM 105. In FIG. 1, the resistor 30 is connected to the logic power 14a (which is represented by a dot in FIG. 1) via cable 14 that connects to the BCM 105, and resistor 32 is connected to ground. The analog input 26 of the microprocessor 24 is connected between the voltage divider resistor pair 30 and 32. The voltage divider resistor pair 30 and 32 are pulled up to a power supply of logic power 14a and read via the analog input 26 by the microprocessor 24. This analog input 26 may be used by the microprocessor 24 along with a ground interrupt field effect transistor (FET) 8 and/or power interrupt field effect transistor (FET) 7. When the heating element ground FET 8 is inactive (such as, e.g., before activation and/or when the FET 8 is momentarily opened during heating), the microprocessor 24 of the heating control module 110 reads the analog input 26 to detect shorts to ground and/or shorts to battery before activation of the first and second heating elements (heaters) 20 and 22. When the FET 8 is not turned on, by reading the analog input 26, the microprocessor 24 can detect when the first heating element 20 is shorted to ground and/or if the first heating element 20 is shorted to battery 28.

Note that the microprocessor 24 may operate for the first heating element 20 and another microprocessor 24 (not shown but represented by dot 34) or set of microprocessor inputs (not shown), analogously operates for (and is connected to) the second heating element 22. One skilled in the art understands the description for microprocessor 24 and the first heating element 20 as it applies to the microprocessor 24 that corresponds to the second heating element 22 or the other set of microprocessor inputs for the second heating element 22.

Each of the microprocessors 24 of the heating control module 110 is configured to monitor the level of absolute current being drawn by the heating elements 20 and 22 at input 27i, so that heating may be terminated if the measured absolute current is outside of its expected operating range. The microprocessors 24 determine the absolute current through FET 7, which controls current to the heating elements 20 or 22, via its input 27i. In one exemplary embodiment, the microprocessors 24 include an internal or external operational amplifier (op amp) 6. The op amp 6 receives and measures absolute current from FET 7's current sense output (e.g., via input 27i) through a resistor 7a. Also, via input 29i, the op amp 6 receives and measures current from the FET 8's current sense output through a resistor 8a.

Via the differential op amp 6, the microprocessors 24 monitor the difference in current going into the heating elements 20 and 22 via FET 7 and current coming back out via FET 8. These current levels via FET 7 and FET 8 should be the same. The microprocessors 24 are configured to terminate heating of the heating elements 20 and 22 and report faults via serial data on cable 16 to the BCM 105, which will turn off all power to the heating module 115, if a difference in current (e.g., greater than a predefined threshold) is detected. In other words, the input current measured at FET 7 should be the same as the output current measured at FET 8.

Additionally, the microprocessors 24 of the heating control module 110 are configured to monitor the level of absolute current drawn by the heating elements 20 and 22 at inputs 27i and 29i, and in one exemplary embodiment these inputs 27i and 29i are Serial Peripheral Interface (SPI) communication inputs to the microprocessors 24, instead of analog inputs, so that heating may be terminated if either reported absolute current level is outside of its expected operating range. The microprocessors 24 receive the absolute current at its SPI inputs 27i and 29i reported by the current sense output of FET 7 and FET 8 instead of through resistors 7a and 8a, which control voltage into and out of the heating elements 20 and 22. In this case, the microprocessors 24 will use software logic instead of an internal or external operational amplifier (op amp) 6, to determine if the absolute current draw into or out of the heating elements 20 and 22 is out of current specification, or the difference in current into or out of the heating elements 20 and 22 is out of current specification.

In this case, via the software logic tracking the absolute current levels and comparing the SPI current level inputs of 27i and 29i, the microprocessors 24 monitor the difference in current going into the heating elements 20 and 22 via FET 7 and current coming back out via FET 8. These current levels via FET 7 and FET 8 should be the same. The microprocessors 24 are configured to terminate heating of the heating elements 20 and 22 and report faults via serial data to the BCM 105, which will turn off all high power to the heating control module 110 and all power to the heating module 115, if a difference in current (e.g., greater than a predefined threshold) is detected. Whether using software logic with the SPI inputs 27i and/or the op amp 6 with the current sense analog input 27i, the input current measured at FET 7 should be the same as the output current measured at FET 8.

The microprocessors 24 also monitor the absolute current going into the heating elements 20 and 22 via FET 7 and current coming back out via FET 8. These current levels are via FET 7 and FET 8. The microprocessors 24 are configured to terminate heating of the heating elements 20 and 22 and report faults via serial data to the BCM 105, which will turn off all high power to the heating control module 110 and all power to the heating module 115, if an absolute in current (e.g., greater than a predefined threshold) is detected. Whether using software logic with the SPI inputs 27i and/or the op amp 6 with the current sense analog input 27i, the input current measured at FET 7 and FET 8 should be less than a predetermined level.

Note in FIG. 1, the current sense output of the FET 7 is operatively connected to input 27i of the microprocessor 24, and the current sense output of the FET 8 is operatively connected to input 29i of the microprocessors 24.

In the heating system 100, there are separate housings for the heating control module 110 and the heating module 115. Accordingly, no fluid 44 may leak into the heating control module 110 from the heating module 115. If fluid heating is required, the heating control module 110 and the heating module 115 are packaged in water tight sealed housings.

The heating control module 110 and the heating module 115 may be packaged in very close proximity (e.g., 1 to 2 inches apart or closer on the same bracket) to each other to minimize a chance of interconnection wiring faults and wiring harness moisture wicking. The connectors 3 and 4 may be wiring harnesses.

High power is provided to the heating module 115 by FETs 7 and 8. An internal heating control module 110 fault would normally cause it to provide high power to the heating module 115. However, since the heating system 100 is configured to only allow power (including serial data and logic power) to the heating control module 110 and the heating module 115 when heating is required, no heating control module 110 power is available for such an internal request, thus eliminating the opportunity for out of specification heating. When heating is required by the BCM 105, upon communication of a detected fault condition (e.g., short to ground and/or short to battery) by the microprocessors 24 to the BCM 105, all power to the heating control module 110 and heating module 115 is removed by the BCM 105, thus again eliminating the opportunity for out of specification heating. The above indicated removal of all power from the heating system 100 when heating is not required is intended to be true even though the BCM's 105 logic power drive capability is required to be limited to a very low level (<250 ma).

When fluid heating is required, the heating control module 110 is in a sealed and vented housing such as an environmental controlled module (ECM), e.g., sealed with a Gotex® patch. The sealed connectors 3 and 4 are located on the bottom of the housings (for the heating control modules 110 and heating module 115) to avoid wire moisture wicking. The top surfaces of the heating control module 110 and the heating module 115 have a greater than (>)15° degree angle to horizontal, which channels moisture off the modules 110, 115 and connectors 3, 4. The heating control module 110 and heating module 115 are preferably packaged out of any drip path and water management areas.

The FETs 7 and 8 are thermo shutdown power supply FETs (latch off FETs) with current sense such that the FETs 7 and 8 turn themselves off when current is above a predefined threshold, thus preventing current from the battery 28 from reaching the heating elements 20, 22 in the heating module 115. The microprocessors 24 are in communication with the BCM 105, and the BCM 105 is configured to terminate all power (e.g., open relays 13 and stop logic power and serial data communications) to the heating control module 110 and the heating module 115 when the measured current (e.g., at FET 7 or FET 8) is outside of current limits (as communicated by the microprocessor 24 to the BCM 105).

As controlled by the microprocessors 24, the FETs 7 and 8 are designed to provide pulse width modulation (PWM) ramp on and ramp off to improve charging system impacts on the vehicle when a large load is placed on the vehicle. PWM control also provides heating of the heating elements 20 and 22 at reduced current consumption capability. For example, FET 8 can be turned on, and the FET 7 can be switched on and off at 50% duty cycle. Switching the FET 7 on and off at 50% duty cycle can reduce the current to the heating elements 20, 22 and reduce the overall load on the vehicle charging system. Instead of providing the full current to the heating elements 20, 22 during normal heating, utilizing PWM with a 50% duty cycle for FET 8 and/or 7 allows a reduced load on the battery 28 (and/or electrical system) of the vehicle, while still providing some heating current to the heating elements 20 and 22.

The circuitry of the heating control module 110 may comprise a 4 layer PCB (not shown) having high and low current partitioned separately and having power and ground partitioned separately.

Due to high power levels, the heating system 100 may provide two heating control power relays 13 (or metal oxide semiconductor field-effect transistor (MOSFET)) which are controlled by the BCM 105 via cable 12. Although two relays 13 are illustrated in FIG. 1, it is contemplated that two MOSFETs may be utilized instead. The first relay 13a may power the first heating element 20 via the microprocessor 24. Through a second microprocessor (not shown and represented by dot 34 connected to the second heating element 22 and connected to the second relay 13b), if available, the second relay 13b powers the second heating element 22. As instructed by the BCM 105, opening the relays 13 allows removal of all high current power when heating is not required for the heating elements 20, 22 and/or under fault conditions. The logic power (e.g., 250 ma) provided on cable 14 is only active when heating is required. Also, two fuses 50 are located between the relays 13 and the heating control module 110, and the two fuses 50 are designed to disrupt the flow of current (i.e., blow) at a predefined current level.

Ground 1 (G1) is operatively connected to the FET 8 and is capable of grounding the total current in the heating control module 110. Ground 2 (G2) is operatively connected to the connector 3. In one implementation, ground 2 may not be utilized when it is not necessary to ensure adequate heating control module 110 ground offset.

Further regarding the BCM 105, the BCM 105 knows and receives various vehicle information, e.g., the BCM 105 is configured to know engine run, battery voltage, charging system state, etc. The BCM 105 controls a fluid heating switch 52 and a fluid pump motor drive 5 for fluid movement.

The BCM 105 is configured to communicate customer information messages, such as heating, pump activation, etc. The BCM 105 is configured to maintain and calibrate fluid pump time, and control the number of heating cycles, heating time, pump activation duration, and heat up power level (e.g., such as a 50% duty cycle) for the heating elements 20 and 22.

As discussed above, the cable 16 is a medium that provides serial data between the BCM 105 and the heating control module 110. The connection over cable 16 may be a LIN with example BCM 105 commands to the heating control module 110 as shown below:

LIN BCM 105 Command Messages:
1) Activate heating element 20, (True=Activate, False=Deactivate 1 LIN bit);
2) Activate heating element 22 (True=Activate, False=Deactivate 1 LIN bit) Deactivated due to: a). Feature canceled by customer, b). Requested off by charging, c). Reported out of temperature specification to BCM 105 via serial communications (heating control module 110 can also self-terminate if an out of temperature specification condition is detected), d). Reported heating element fault to BCM 105 via serial communications (heating control module 110 can also self-terminate if out of temperature specification is detected);
3) Commanded heating regulation temperature (8 LIN bits);
4) Commanded out of temperature specification, shut off temperature (8 LIN bits);
5) Heating element 20 activation duty cycle. (On/off ramp rate with wave shape (4 LIN bits)); and
6) Heating element 22 activation duty cycle. (On/off ramp rate with wave shape (4 LIN bits)).

The heating control module 110 provides various status messages to the BCM 105, as shown below.

Figure 3:
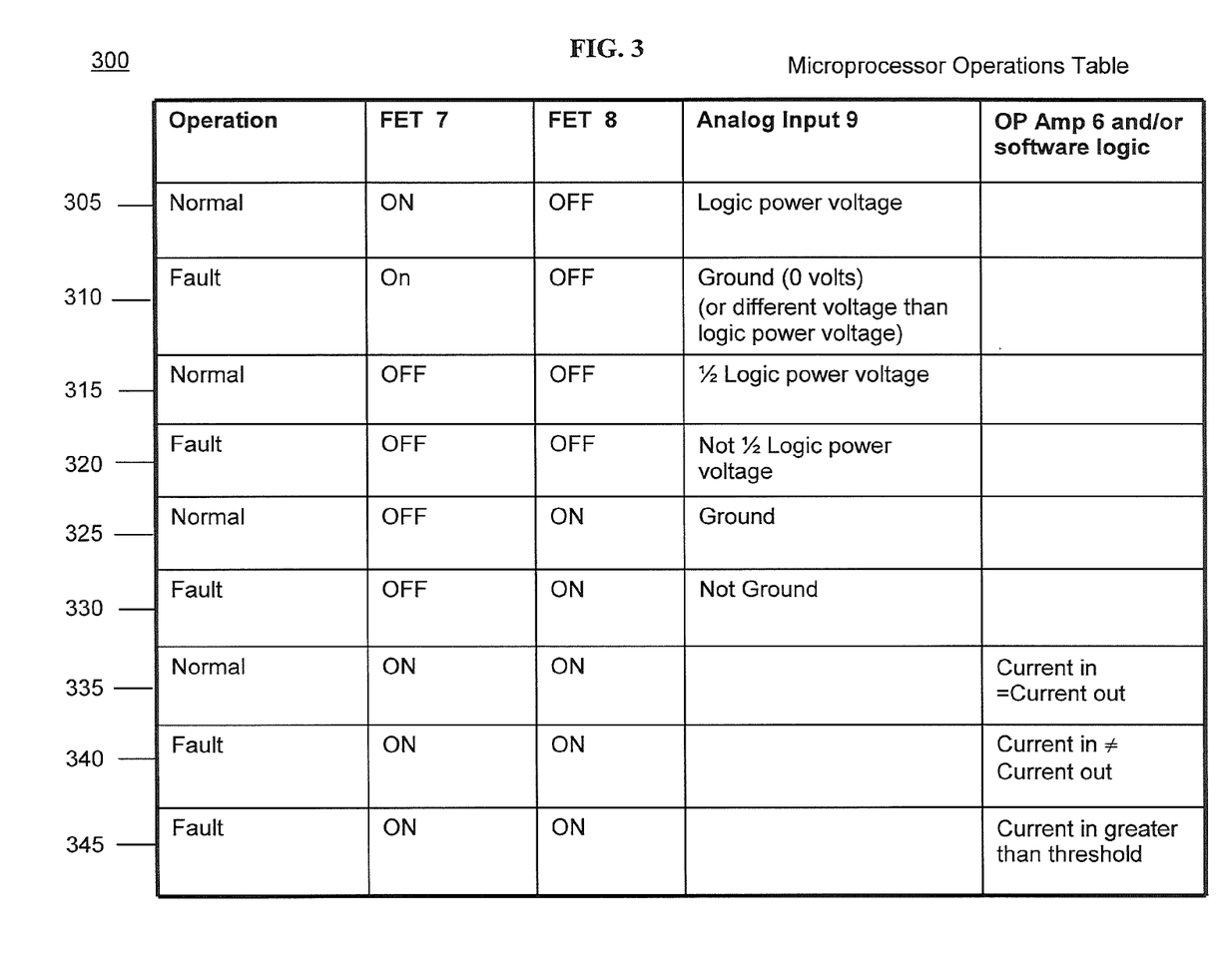
FIG. 3 illustrates a table in accordance with exemplary embodiments.

LIN heating control module 110 status messages:
1) Heating element 20 current fault—heating control module 110 detects faults and terminates heating (1 LIN bit);
2) Heating element 22 current fault—heating control module detects faults and terminates heating (1 LIN bit);
3) Differential current 1 fault—heating control module detects faults and terminates heating (1 LIN bit);
4) Differential current 2 fault—heating control module detects faults and terminates heating (1 LIN bit);
5) Out of temperature specification fault;
6) Temperature differential fault;
7) Temperature sense fault (heating control module self-terminates heating upon loss of communications with BCM and/or upon its internal detection of above noted errors);
8) Heating element 20 thermistor (fluid temperature) (8 LIN bits); and
9) Heating element 22 thermistor (fluid temperature) (8 LIN bits);

FIG. 3 illustrates a logic table 300 for fault detection and fault handling by the microprocessors 24 according to exemplary embodiments. For fault detection, the microprocessors 24 monitor analog input 26, FET 7 input 27i, and FET 8 input 29i. When a fault is detected by the microprocessors 24, the microprocessors 24 instruct the BCM 105 to open the relays 13. In the examples below assume logic power 14a voltage is 12 volts and the resistors 30 and 32 are of similar value.

As shown in row 305, when the FET 7 is on and FET 8 is off, the microprocessors 24 determine normal operation when the analog input 26 measures battery 28 voltage. As seen in row 310, when the FET 7 is on and FET 8 is off, the microprocessors 24 determine a fault condition when the analog input 26 measures ground (0 volts) and/or substantially less than logic power 14a voltage, e.g., measures 8 volts or below at analog input 26. In other words, the microprocessors 24 determine a fault condition when the analog input 26 fails to measure the logic voltage which is a nominal voltage.

If resistors 30 and 32 are the same resistance, when the FET 7 is off and FET 8 is off, the microprocessors 24 should read half of the logic power voltage 14a (e.g., 6 volts) in normal operation in row 315. When the FET 7 is off and FET 8 is off, the microprocessors 24 determine a fault when the analog input 26 does not read half of the logic power 14a, e.g., the analog input 26 may read less than 4 volts or may ready greater than 7 volts in row 320.

When the FET 7 is off and FET 8 is on, the microprocessors 24 should read ground (i.e., nominal voltage) at analog input 26 for normal operation at row 325. When the FET 7 is off and FET 8 is on, the microprocessor 24 determines a fault condition when the analog input 26 does not read ground (e.g., nominal voltage) at row 330.

When FET 7 and FET 8 are on, the microprocessors 24 should determine that current in (input 27i connected to FET 7) equals current out (input 29i connected to FET 8) for normal operation at row 335. In row 340, when FET 7 and FET 8 are on, the microprocessors 24 determine a fault condition when the current in does not equal current out, (e.g., when the current differential (at the op amp 6 and/or by the software logic) is greater than a predetermined differential current threshold). Also, when the current in (into heating element 20 or 22) is greater than design limits, the microprocessors 24 determine that there is a fault condition in row 345.

Additionally, the microprocessors 24 determine a fault condition when the current from the FET 8 exceeds a current threshold, and the microprocessors 24 determine a fault condition when the current from the FET 7 exceeds a current threshold. Also, the microprocessors 24 determine a fault condition when the FET 7 and the FET 8 are powered on and when the microprocessors 24 do not detect half the logic voltage at the analog input 26. The microprocessors 24 determine normal operation when the FET 7 is powered on and the FET 8 is powered on and when the microprocessors 24 detect half logic power voltage (i.e., half the value of the logic power voltage) at the analog input 26.

Figure 4:
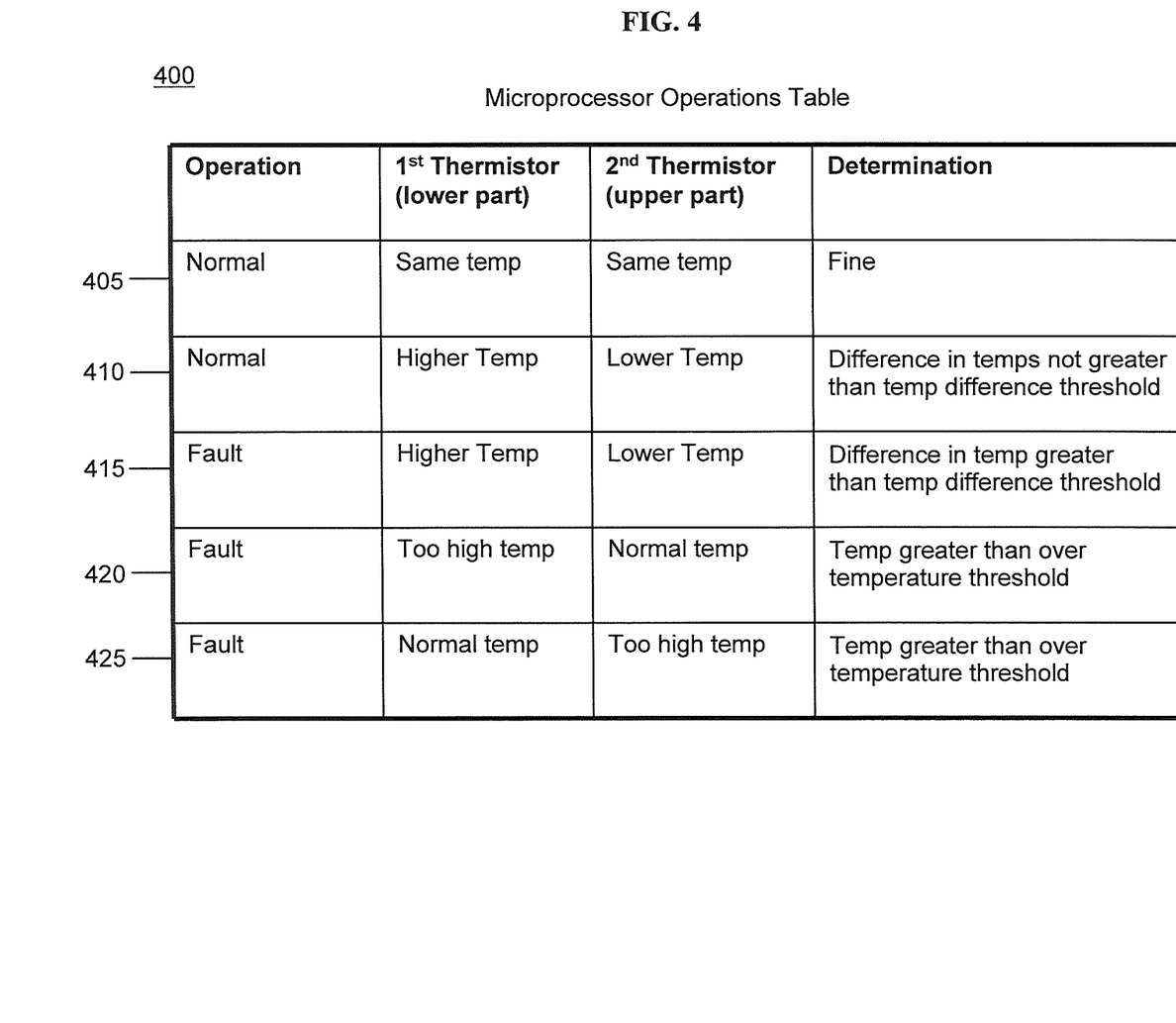
FIG. 4 illustrates a table in accordance with exemplary embodiments.

FIG. 4 illustrates a table 400 for fault detection and fault handling by the microprocessors 24 according to exemplary embodiments. As seen in rows 405 and 410, the microprocessors 24 determine a normal operation when the thermistors 10 and 11 have the same temperature and/or when the thermistors 10 and 11 have a temperature difference within a predefined threshold. As seen in rows 415, 420, and 425, the microprocessors 24 determine there is a fault when the thermistors 10 and 11 have a temperature difference greater than a predefined temperature difference threshold and/or when either thermistors 10 or 11 read a temperature that is greater than a predefined (maximum) temperature. Also, the microprocessors 24 determine a fault condition when any one (or both) of the temperatures for the thermistors 10 and 11 is less than a minimum temperature after the FET 7 is powered on and the FET 8 is powered on.

The microprocessors 24 may comprise multiple processors, software, memory, logical circuitry, and power supply system components to operate as discussed herein. The microprocessors 24 can store each of the fault conditions and fault handling discussed herein including examples shown in tables 300 and 400 in FIGS. 3 and 4.

Figure 5:
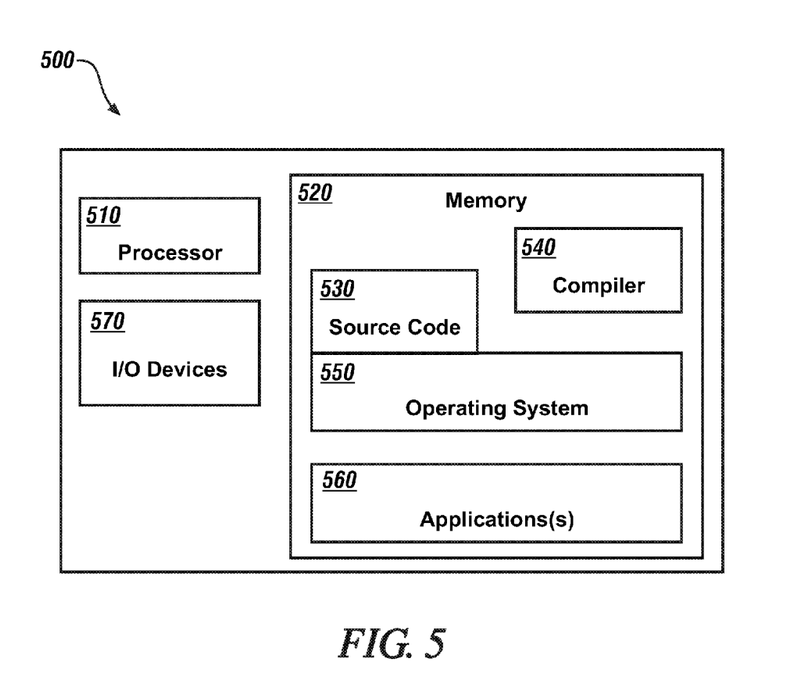
FIG. 5 illustrates a computer system which may be utilized to implement exemplary embodiments.

FIG. 5 illustrates an example of a computer 500 having capabilities, which may be included in (any element of) exemplary embodiments. Various methods, procedures, software logic, modules, flow diagrams, tools, application, and techniques discussed herein may also incorporate and/or utilize the capabilities of the computer 500. Moreover, capabilities of the computer 500 may be utilized to implement various features of exemplary embodiments discussed herein.

Generally, in terms of hardware architecture, the computer 500 may include one or more processors 510, computer readable storage memory 520, and one or more input and/or output (I/O) devices 570 that are communicatively coupled via a local interface (not shown). The local interface can be, for example but not limited to, one or more buses or other wired or wireless connections, as are known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 510 is a hardware device for executing software that can be stored in the memory 520. The processor 510 can be virtually any custom made or commercially available processor, a central processing unit (CPU), a data signal processor (DSP), or an auxiliary processor among several processors associated with the computer 500, and the processor 510 may be a semiconductor based microprocessor (in the form of a microchip) or a microprocessor, or state machine based controller.

The computer readable memory 520 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM) or the like, etc.). Moreover, the memory 520 may incorporate electronic, magnetic, optical, and/or other types of storage media. Note that the memory 520 can have a distributed architecture, where various components are situated remote from one another, but can be accessed by the processor 510.

The software in the computer readable memory 520 may include one or more separate programs, each of which comprises an ordered listing of executable instructions for implementing logical functions. The software in the memory 520 may include a suitable (vehicle) operating system (O/S) 550, compiler 540, source code 530, and one or more applications 560 of the exemplary embodiments. As illustrated, the application 560 comprises numerous functional components for implementing the features, processes, methods, functions, and operations of the exemplary embodiments.

The application(s) 560 may employ a service-oriented architecture, which may be a collection of services that communicate with each other. Also, the service-oriented architecture allows two or more services to coordinate and/or perform activities (e.g., on behalf of one another). Each interaction between services can be self-contained and loosely coupled, so that each interaction is independent of any other interaction.

Further, the application 560 may be a source program, executable program (object code), script, or any other entity comprising a set of instructions to be performed. When a source program, then the program is usually translated via a compiler (such as the compiler 540), assembler, interpreter, or the like, which may or may not be included within the memory 520, so as to operate properly in connection with the O/S 550. Furthermore, the application 560 can be written as (a) an object oriented programming language, which has classes of data and methods, or (b) a procedure programming language, which has routines, subroutines, and/or functions.

The I/O devices 570 may include input devices (or peripherals) for receiving inputs and transmitting outputs.

One skilled in the art understands FETs and understands that FETs include a gate, drain, and source terminal, and that the minimum gate voltage has to be applied to power on the FET. The gate voltage is applied by the microprocessor 24 to turn on (and off) the FETs 7 and 8.

The terminology used herein is for the purpose of describing particular embodiments only and is not intended to be limiting of the invention. As used herein, the singular forms "a", "an" and "the" are intended to include the plural forms as well, unless the context clearly indicates otherwise.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments, but that the invention will include all embodiments falling within the scope of the present application.

What is claimed is:

1. A heating system for a vehicle, the system comprising:
   a heating control module comprising a microprocessor configured for heating fault detection and heating fault handling, a first field effect transistor (FET) operatively connected to the microprocessor, and a second field effect transistor (FET) operatively connected to the microprocessor; and
   a heating module comprising a heating element, a first thermistor operatively connected to the microprocessor, and a second thermistor operatively connected to the microprocessor;
   wherein the microprocessor is configured to:
   determine a fault condition when a temperature difference between a first temperature of the first thermistor and a second temperature of the second thermistor exceeds a temperature difference threshold;
   determine the fault condition when at least one of the first temperature of the first thermistor and the second temperature of the second thermistor is less than a minimum temperature after the first FET is powered on and the second FET is powered on;
   determine the fault condition when the first FET is powered on and the second FET is powered off and when the microprocessor does not detect logic voltage at an analog input; and
   determine the fault condition when the first FET is powered off and the second FET is powered off and when the microprocessor does not detect half the logic voltage at the analog input.

2. The heating system of claim 1, wherein the microprocessor is configured to:
   determine the fault condition when at least one of the first temperature of the first thermistor and the second temperature of the second thermistor exceeds a temperature specification;
   determine the fault condition when the first FET is powered off and the second FET is powered on and when the microprocessor does not detect 0 volts at the analog input; and
   determine the fault condition when the first FET is powered on and the second FET is powered on and when the microprocessor does not detect half the logic voltage at the analog input.

3. The heating system of claim 1, wherein the microprocessor is configured to:
   determine the fault condition when a current from the first FET does not equal a current from the second FET;
   determine the fault condition when the current from the first FET exceeds a current threshold; and
   determine the fault condition when the current from the second FET exceeds the current threshold.

4. The heating system of claim 1, wherein a source of the first FET is operatively connected to a battery through a relay; and
   wherein a drain of the first FET is operatively connected to the heating element.

5. The heating system of claim 1, wherein a source of the second FET is operatively connected to the heating element; and
   wherein a drain of the second FET is operatively connected to ground.

6. The heating system of claim 1, wherein a gate of the first FET is operatively connected to the microprocessor and a gate of the second FET is operatively connected to the microprocessor.

7. The heating system of claim 1, wherein the microprocessor is configured to detect fault conditions by monitoring at least one of the following: the analog input, the first FET, the second FET, the first thermistor, and the second thermistor.

8. The heating system of claim 1, wherein a top of the heating control module and a top of the heating module are angled at least at a 15 degree angle.

9. The heating system of claim 1, wherein the microprocessor is configured to determine normal operation of the heating system:
   when the first FET is powered on and the second FET is powered off and when the microprocessor detects logic voltage at the analog input; and
   when the first FET is powered off and the second FET is powered off and when the microprocessor detects half the logic voltage at the analog input.

10. The heating system of claim 1, wherein the microprocessor is configured to determine normal operation of the heating system:
    when the first FET is powered off and the second FET is powered on and when the microprocessor detects ground at the analog input;
    when the first FET is powered on and the second FET is powered on and when the microprocessor detects half logic power voltage at the analog input; and
    when the first FET is powered on and the second FET is powered on and when the microprocessor detects that a current from the first FET equals a current from the second FET.

11. A method for a heating system of a vehicle, the method comprising:
    configuring a heating control module comprising a microprocessor configured for heating fault detection and heating fault handling, a first field effect transistor (FET) operatively connected to the microprocessor, and a second field effect transistor (FET) operatively connected to the microprocessor; and
    configuring a heating module comprising a heating element, a first thermistor operatively connected to the microprocessor, and a second thermistor operatively connected to the microprocessor;
    wherein the microprocessor is configured to:
    determine a fault condition when a temperature difference between a first temperature of the first thermistor and a second temperature of the second thermistor exceeds a temperature difference threshold;
    determine the fault condition when at least one of the first temperature of the first thermistor and the second temperature of the second thermistor is less than a minimum temperature after the first FET is powered on and the second FET is powered on;
    determine the fault condition when the first FET is powered on and the second FET is powered off and when the microprocessor does not detect logic voltage at an analog input; and
    determine the fault condition when the first FET is powered off and the second FET is powered off and when the microprocessor does not detect half the logic voltage at the analog input.

12. The method of claim 11, wherein the microprocessor is configured to:
    determine the fault condition when at least one of the first temperature of the first thermistor and the second temperature of the second thermistor exceeds a temperature specification;
    determine the fault condition when the first FET is powered off and the second FET is powered on and when the microprocessor does not detect 0 volts at the analog input; and
    determine the fault condition when the first FET is powered on and the second FET is powered on and when the microprocessor does not detect half the logic voltage at the analog input.

13. The method of claim 11, wherein the microprocessor is configured to:
    determine the fault condition when a current from the first FET does not equal a current from the second FET;
    determine the fault condition when the current from the first FET exceeds a current threshold; and
    determine the fault condition when the current from the second FET exceeds the current threshold.

14. The method of claim 11, wherein a source of the first FET is operatively connected to a battery through a relay; and
    wherein a drain of the first FET is operatively connected to the heating element.

15. The method of claim 11, wherein a source of the second FET is operatively connected to the heating element; and
    wherein a drain of the second FET is operatively connected to ground.

16. The method of claim 11, wherein a gate of the first FET is operatively connected to the microprocessor and a gate of the second FET is operatively connected to the microprocessor.

17. The method of claim 11, wherein the microprocessor is configured to detects fault conditions by monitoring at least one of the following: the analog input, the first FET, the second FET, the first thermistor, and the second thermistor.

18. The method of claim 11, wherein a top of the heating control module and a top of the heating module are angled at least at a 15 degree angle.

19. The method of claim 11, wherein the microprocessor is configured to determine normal operation of the heating system:
    when the first FET is powered on and the second FET is powered off and when the microprocessor detects logic voltage at the analog input; and
    when the first FET is powered off and the second FET is powered off and when the microprocessor detects half the logic voltage at the analog input.

20. The method of claim 11, wherein the microprocessor is configured to determine normal operation of the heating system:
- when the first FET is powered off and the second FET is powered on and when the microprocessor detects ground at the analog input;
- when the first FET is powered on and the second FET is powered on and when the microprocessor detects half logic power voltage at the analog input; and
- when the first FET is powered on and the second FET is powered on and when the microprocessor detects that a current from the first FET equals a current from the second FET.

* * * * *